US007494606B2

(12) United States Patent
Takahashi et al.

(10) Patent No.: US 7,494,606 B2
(45) Date of Patent: Feb. 24, 2009

(54) OXYNITRIDE PHOSPHOR AND SEMICONDUCTOR LIGHT-EMITTING DEVICE

(75) Inventors: Kohsei Takahashi, Kobe (JP); Naoto Hirosaki, Tsukuba (JP)

(73) Assignees: Sharp Kabushiki Kaisha, Osaka (JP); National Institute for Materials Science, Ibaraki (JP)

( * ) Notice: Subject to any disclaimer, the term of this patent is extended or adjusted under 35 U.S.C. 154(b) by 292 days.

(21) Appl. No.: 11/360,373

(22) Filed: Feb. 22, 2006

(65) Prior Publication Data

US 2006/0186377 A1    Aug. 24, 2006

(30) Foreign Application Priority Data

Feb. 22, 2005   (JP) .............................. 2005-045009

(51) Int. Cl.
*C09K 11/74* (2006.01)
*H01L 33/00* (2006.01)

(52) U.S. Cl. .............................. 252/301.4 F; 313/503; 257/98

(58) Field of Classification Search .......... 252/301.4 F; 313/503; 257/98
See application file for complete search history.

(56) References Cited

U.S. PATENT DOCUMENTS 6,670,748 B2 * 12/2003 Ellens et al. ................. 313/503
2007/0018567 A1 * 1/2007 Hirosaki ..................... 313/503

FOREIGN PATENT DOCUMENTS

CN          1839193 A      9/2006
JP          09-153644 A    6/1997

(Continued)

OTHER PUBLICATIONS

Grins, J. et al. (1995). "Preparation and Crystal Structure of LaAl(Si6-zAlZ)N$_{10-z}$O$_z$," *J. Mater. Chem.* 5(11):2001-2006.
Izumi, F. et al. (2000). "A Rietveld-Analysis Program Rietan-98 and its Applications to Zeolites," *Materials Science Forum* 321-324:198-204.

(Continued)

*Primary Examiner*—C. Melissa Koslow
(74) *Attorney, Agent, or Firm*—Morrison & Foerster LLP

(57) ABSTRACT

The invention provides an oxynitride phosphor represented by a composition formula $M_{1-a}Ce_aSi_bAl_cO_dN_e$, wherein M denotes La or a compound of which main component is La and sub-component is at least one kind of element selected from the group consisting of Pr, Nd, Sm, Eu, Gd, Th, Dy, Ho, Er, Tm, Yb and Lu; the a that represents a composition ratio of Ce is a real number satisfying $0.1 \leq a \leq 1$; the b that represents a composition ratio of Si is a real number satisfying $b=(6-z)\times f$; the c that represents a composition ratio of Al is a real number satisfying $c=(1+z)\times g$; the d that represents a composition ratio of O is a real number satisfying $d=z\times h$; the e that represents a composition ratio of N is a real number satisfying $e=(10-z)\times i$; the z is a real number satisfying $0.1 \leq z \leq 3$; the f is a real number satisfying $0.7 \leq f \leq 1.3$; the g is a real number satisfying $0.7 \leq g \leq 3$; the h is a real number satisfying $0.7 \leq h \leq 3$; the i is a real number satisfying $0.7 \leq i \leq 1.3$; and a JEM phase is contained in an amount of 50% or more, and a semiconductor light-emitting device that uses the oxynitride phosphor.

19 Claims, 8 Drawing Sheets

FOREIGN PATENT DOCUMENTS

| | | |
|---|---|---|
| JP | 10-012925 A | 1/1998 |
| JP | 10-163535 A | 6/1998 |
| JP | 10-242513 A | 9/1998 |
| JP | 2002-017100 A | 1/2002 |
| JP | 2002-363554 A | 12/2002 |
| JP | 2003-206481 A | 7/2003 |
| WO | WO2005/019376 * | 3/2005 |
| WO | WO-2005/019376 A1 | 3/2005 |

OTHER PUBLICATIONS

Ohkubo, K. et al. (1999). "Absolute Fluorescent Quantum Efficiency of NBS Phosphor Standard Samples," *J. Illum. Eng. Inst. Jpn.* 83(2):87-93 (Partial English Translation, six pages.)

Rong-Jun Xie et al.—"Photoluminescence of Cerium-Doped α-SiAlON Materials," Journal of the American Ceramic Society, vol. 87, No. 7, Jul. 2004, pp. 1368-1370.

* cited by examiner

OXYNITRIDE PHOSPHOR AND SEMICONDUCTOR LIGHT-EMITTING DEVICE

This nonprovisional application is based on Japanese Patent Application No. 2005-045009 filed with the Japan Patent Office on Feb. 22, 2005, the entire contents of which are hereby incorporated by reference.

BACKGROUND OF THE INVENTION

1. Field of the Invention

The present invention relates to an oxynitride phosphor that has a JEM phase as a main component and a semiconductor light-emitting device using the oxynitride phosphor. Specifically, the invention relates to a semiconductor light-emitting device that can be used for a backlight light source for liquid crystal displays, a portable telephone, a portable information terminal, an LED (light-emitting diode) display device used for indoor and outdoor advertisements, an indicator for various kinds of portable units, or a light source for an illumination switch or OA (office automation) units. The invention particularly relates to a semiconductor light-emitting device where an oxynitride phosphor converts an wavelength of emission from a semiconductor light-emitting element to use as a light source and an oxynitride phosphor suitable for the semiconductor light-emitting device.

2. Description of the Background Art

A semiconductor light-emitting device is small in size, less in the power consumption, and stable in high brightness emission. Accordingly, it is in wide use as a light source of various kinds of display devices. Furthermore, the semiconductor light-emitting device is also used as a light source for reading and/or writing information in various kinds of information processors. So far, as a semiconductor light-emitting element used in a semiconductor light-emitting device that emits visible light, depending on forming conditions of a semiconductor material that is used in an emitting layer, ones that emit light from red to purple have been put into practical use.

With the semiconductor light-emitting elements that emit various emission colors, for instance, with light-emitting diodes (LED) each of which emits one of three primary colors of red, green and blue, an image display device is put into practical use.

Furthermore, in for instance Japanese Patent Laying-Open No. 10-242513, a semiconductor light-emitting device where a semiconductor light-emitting element that emits short wavelength visible light from blue to purple and a phosphor are combined and thereby emission of the semiconductor light-emitting element and light that is wavelength-converted by the phosphor are mixed to obtain white light is disclosed.

Still furthermore, in Japanese Patent Laying-Open No. 10-163535, a semiconductor light-emitting device where a semiconductor light-emitting element that emits blue or bluish purple light is combined with one kind or two kinds of phosphors is disclosed. Here, the phosphor is selected so that emission color of the semiconductor light-emitting element and emission color of the phosphor may be mutually complementary colors to emit pseudo-white light.

Furthermore, in Japanese Patent Laying-Open No. 10-012925, a semiconductor light-emitting device that is provided with a semiconductor light-emitting element that emits ultra-violet light and near ultra-violet light and a phosphor is disclosed. The semiconductor light-emitting element is a semiconductor light-emitting element that normally emits blue light and, when a pulse-like large current is flowed to the semiconductor light-emitting element, emits ultra-violet light or near ultra-violet light. Here, a technology where only by changing a kind of the phosphor, with only one kind of semiconductor light-emitting element, a plurality of colors can be emitted is disclosed.

Still furthermore, in Japanese Patent Laying-Open No. 09-153644, a dot matrix type display device that is provided with an emitting layer that is formed by use of a III group nitride semiconductor and emits ultraviolet light having a peak wavelength of 380 nm and three kinds of phosphor layers that receive ultraviolet light from the emitting layer to respectively emit lights of three primary colors of red, green and blue is disclosed.

Furthermore, in Japanese Patent Laying-Open No. 2002-017100, a semiconductor light-emitting device where a semiconductor light-emitting element that emits light having a wavelength in the range of 390 nm to 420 nm and a phosphor that is excited by the emission from the semiconductor light-emitting element are used to emit white light is disclosed. Here, since the semiconductor light-emitting element emits light low in the human visual sensitivity, a variation of the emission intensity or emission wavelength of the semiconductor light-emitting element seems to hardly affect on the color tone. Furthermore, light having a wavelength in the range of 390 to 420 nm hardly damages device constituent components such as a resin in which the phosphor is dispersed. Still furthermore, in general, ultraviolet light variously adversely affects on human bodies; however, since light having a wavelength of 390 nm or more is used, leaked excitation light does not adversely affect. In this case, as the phosphor that can be excited by light having a wavelength in the range of 390 nm to 420 nm to luminesce, various oxide and sulfide phosphors are being used.

As the phosphor that is used in the above-mentioned applications, other than oxide and sulfide phosphors, recently, examples of oxynitride and nitride phosphors are disclosed in Japanese Patent Laying-Open Nos. 2002-363554 and 2003-206481. The phosphors can be excited by light having a wavelength in the range of 390 nm to 420 nm and have high emission efficiency. Furthermore, these phosphors are high in the stability and hardly exhibit variation of the emission efficiency when an environmental temperature varies. That is, the above-mentioned phosphors have excellent characteristics in many cases.

SUMMARY OF THE INVENTION

In order to realize a semiconductor light-emitting device that uses a semiconductor light-emitting element that emits light having a wavelength in the range of, for instance, 390 nm to 420 nm as an excitation light source, phosphors that luminesce efficiently over a wide visible light region from blue through green to red are necessary. So far, as phosphors that are excited by the light having a wavelength in the range of 390 nm to 420 nm to luminesce, red and green-emitting ones have been obtained. However, a phosphor that is excellent in the emission efficiency of light from blue to bluish purple mainly made of wavelengths of 510 nm or less and has sufficient stability has not yet been found.

In the invention, by use of an oxynitride material that is excellent in the environmental resistance and the temperature stability, an oxynitride phosphor capable of efficiently emitting light having a wavelength mainly of 510 nm or less and a semiconductor light-emitting device using the oxynitride phosphor are provided.

The inventors, in order to overcome the problems, intensively studied oxynitride materials containing elements of $M^1$, Si (silicon), Al (aluminum), O (oxygen) and N (nitrogen)

and found that one having a specific composition and crystal phase becomes an effective phosphor. In particular, it is found that an oxynitride material having a composition formula represented by $M^1_{1-a}Ce_aSi_bAl_cO_dN_e$ can be excited by light having a wavelength from purple to near ultraviolet and emits light generally at the brightness higher than that of β sialon. The $M^1$ denotes at least one kind of element selected from the group consisting of La (lanthanum), Ce (cerium), Pr (praseodymium), Nd (neodymium), Sm (samarium), Eu (europium), Gd (gadolinium), Th (terbium), Dy (dysprosium), Ho (holmium), Er (erbium), Tm (thulium), Yb (ytterbium), and Lu (lutetium).

Furthermore, an oxynitride material containing a JEM phase is a substance that is confirmed by Jekabs Grins et al that it can be generated in a process of preparing α sialon stabilized by a rare earth element (Jekabs Grins et al, "Preparation and Crystal Structure of $LaAl(Si_{6-z}AL_z)N_{10-z}O_z$", J. MATER. CHEM., 1995, 5(11), pp. 2001-2006).

According to the report, the JEM phase is a crystal phase that is generally represented by a formula $M^1Al(Si_{6-z})N_{10-z}O_z$ (here, $M^1$ denotes at least one kind of element selected from the group consisting of La, Ice, Pr, Nd, Sm, Ear, Gd, Tm, Dy, Ho, Er, Tm, Yb and Lu) and has a specific atomic arrangement made of a composition with z as a parameter, and the JEM phase is excellent in the heat resistance. It is defined as a substance that has specific sites occupied by atoms (atomic arrangement structure) such as shown in Table 1 and a crystal structure (Pbcn space group) characterized by coordinates thereof.

TABLE 1

|  | Atom | Site | Coordinate (x) | Coordinate (y) | Coordinate (z) |
|---|---|---|---|---|---|
| (1) | RE | 8d | 0.0553 | 0.0961 | 0.1824 |
| (2) | Al | 4c | 0 | 0.427 | 0.25 |
| (3) | M(1) | 8d | 0.434 | 0.185 | 0.057 |
| (4) | M(2) | 8d | 0.27 | 0.082 | 0.52 |
| (5) | M(3) | 8d | 0.293 | 0.333 | 0.337 |
| (6) | X(1) | 8d | 0.344 | 0.32 | 0.14 |
| (7) | X(2) | 8d | 0.383 | 0.21 | 0.438 |
| (8) | X(3) | 8d | 0.34 | 0.485 | 0.41 |
| (9) | X(4) | 8d | 0.11 | 0.314 | 0.363 |
| (10) | X(5) | 8d | 0.119 | 0.523 | 0.127 |

Space group: Pbcn

In table 1, a mark of a site is a mark that shows symmetric property of a space group. A coordinate takes a value from 0 to 1 for each of x, y and z lattices. Furthermore, in RE, $M_1$ and Ce enter at probabilities of the respective composition ratios. In M(1) through M(3), Si and Al enter at probabilities of the respective composition ratios. In X(1) through X(5), N and O enter at probabilities of the respective composition ratios. When X-ray diffraction data calculated with values in Table 1 and X-ray diffraction results obtained by measuring are compared, an obtained material can be identified whether it is a JEM phase or not.

As to the oxynitride material containing a JEM phase, the heat resistance characteristics are exclusively studied and there is no specific example where it is used as a phosphor. The present inventors specifically found for the first time that the oxynitride material containing a JEM phase can be excited by light having a wavelength from purple to near ultraviolet and can be used as a phosphor having the emission efficiency at high brightness. The inventors, after further developing and studying the findings, found that by applying a configuration described below a specific emission phenomenon excellent in the brightness characteristics in a specific wavelength region can be obtained. The inventors, based on the findings, suc-ceeded in providing an oxynitride phosphor that can be excited by light having a wavelength of 370 nm or more and 420 nm or less, more preferably a wavelength of 390 nm or more and 420 nm or less, and emits light efficiently, and a semiconductor light-emitting device using the oxynitride phosphor. The configuration is as follows.

That is, the invention relates to an oxynitride phosphor that is represented by a composition formula $M_{1-a}Ce_aSi_bAl_cO_dN_e$, wherein M denotes La or a compound of which main component is La and sub-component is at least one kind of element selected from the group consisting of Pr, Nd, Sm, Eu, Gd, Th, Dy, Ho, Er, Tm, Yb and Lu, a that represents a composition ratio of Ce is a real number satisfying $0.1 \leq a \leq 1$, b that represents a composition ratio of Si is a real number satisfying $b=(6-z)\times f$, c that represents a composition ratio of Al is a real number satisfying $c=(1+z)\times g$, d that represents a composition ratio of O is a real number satisfying $d=z\times h$, e that represents a composition ratio of N is a real number satisfying $e=(10-z)\times i$, z is a real number satisfying $0.1 \leq z \leq 3$, f is a real number satisfying $0.7 \leq f \leq 1.3$, g is a real number satisfying $0.7 \leq g \leq 3$, h is a real number satisfying $0.7 \leq h \leq 3$ and i is a real number satisfying $0.7 < i < 1.3$, and contains a JEM phase in an amount of 50% or more. In the invention, "La as a main component" means that 50% or more of an element that constitutes M is La and "sub-component" means an element smaller in the composition ratio than that of La that is a main component.

An oxynitride phosphor according to the invention preferably contains 50% or more of a JEM phase represented by a formula $M_{1-a}Ce_aAl(Si_{6-z}Al_z)N_{10-z}O_z$ in the oxynitride phosphor. In the invention, an element shown by "M" and a value of "a" in a formula $M_{1-a}Ce_aAl(Si_{6-z}Al_z)N_{10-z}O_z$ may be same as an element shown by "M" and a value of "a" in a composition formula $M_{1-a}Ce_aSi_bAl_cO_dN_e$ of the oxynitride phosphor, respectively, or different from each other.

Furthermore, an emission peak wavelength of the oxynitride phosphor according to the invention is preferably 460 nm or more and 510 nm or less. In the invention, an emission peak wavelength means a wavelength of light of which emission intensity is the largest.

Still furthermore, in the oxynitride phosphor according to the invention, a JEM phase is preferably contained in an amount of 70% or more and 90% or less.

In the oxynitride phosphor according to the invention, the d is preferably a real number satisfying $1 < d \leq 2$ and the e is preferably a real number satisfying $8 < e < 9$.

Furthermore, the invention relates to a semiconductor light-emitting device that includes a semiconductor light-emitting element that emits light having an emission peak wavelength of 370 nm or more and 420 nm or less and a first phosphor that is excited by light emitted from the semiconductor light-emitting element and has an emission peak wavelength of 460 nm or more and 510 nm or less, wherein the first phosphor is any one of the foregoing oxynitride phosphors.

Here, in the semiconductor light-emitting device according to the invention, it is preferable that a composition ratio a of Ce of the first phosphor is $0.8 \leq a \leq 1$, a color coordinate x of an emission color from the first phosphor is 0.22 or more and 0.44 or less, and a color coordinate y thereof is 0.22 or more and 0.44 or less.

Furthermore, the invention relates to a semiconductor light-emitting device that includes a semiconductor light-emitting element that emits light of which emission peak wavelength is 370 nm or more and 420 nm or less, a first phosphor that is excited by light emitted from the semiconductor light-emitting element and has an emission peak wavelength of 460 nm or more and 510 nm or less, and a second phosphor that is excited by light emitted from the semiconductor light-emitting element and has an emission peak wavelength of 510 nm or more and 670 nm or less, wherein the first phosphor is any one of the foregoing oxynitride phosphors.

Here, in the semiconductor light-emitting device according to the invention, the second phosphor preferably contains Si and N in a total amount of 50% by mole or more.

Still furthermore, the invention relates to a semiconductor light-emitting device that includes a semiconductor light-emitting element that emits light of which emission peak wavelength is 370 nm or more and 420 nm or less, a first phosphor that is excited by light emitted from the semiconductor light-emitting element and has an emission peak wavelength of 460 nm or more and 510 nm or less, a second phosphor that is excited by light emitted from the semiconductor light-emitting element and has an emission peak wavelength of 600 nm or more and 670 nm or less, and a third phosphor that is excited by light emitted from the semiconductor light-emitting element and has an emission peak wavelength of 510 nm or more and 550 nm or less, wherein the first phosphor is any one of the foregoing oxynitride phosphors, and at least one of the second and third phosphors contains Si and N in a total amount of 50% by mole or more.

Furthermore, in the semiconductor light-emitting device according to the invention, the semiconductor light-emitting element preferably contains an InGaN active layer.

Still furthermore, in the semiconductor light-emitting device according to the invention, an emission peak wavelength of the semiconductor light-emitting element is preferably 390 nm or more and 420 nm or less.

Furthermore, in the semiconductor light-emitting device according to the invention, it is preferable that a color coordinate x of an emission color of emission from the semiconductor light-emitting device is 0.22 or more and 0.44 or less, and a color coordinate y thereof is 0.22 or more and 0.44 or less, alternatively a color coordinate x of an emission color of emission from the semiconductor light-emitting device is 0.36 or more and 0.5 or less, and a color coordinate y thereof is 0.33 or more and 0.46 or less.

The oxynitride phosphor according to the invention exhibits brightness higher than that of an existing sialon phosphor, in particular, it can efficiently emit light of a wavelength of 510 nm or less. Furthermore, since the oxynitride phosphor according to the invention is mainly made of an oxynitride phosphor excellent in the heat resistance, when it is exposed to light excitation, in comparison with other general phosphor materials, material deterioration and brightness deterioration are less.

Furthermore, the oxynitride phosphor according to the invention, when it is excited by light having a wavelength of 390 nm or more and 420 nm or less where the photo-electric conversion efficiency is highest in a semiconductor light-emitting element such as a LED or laser that has an active layer made of for instance InGaN, has excellent emission efficiency. Accordingly, a semiconductor light-emitting device that uses the oxynitride phosphor according to the invention has high emission efficiency as a whole.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
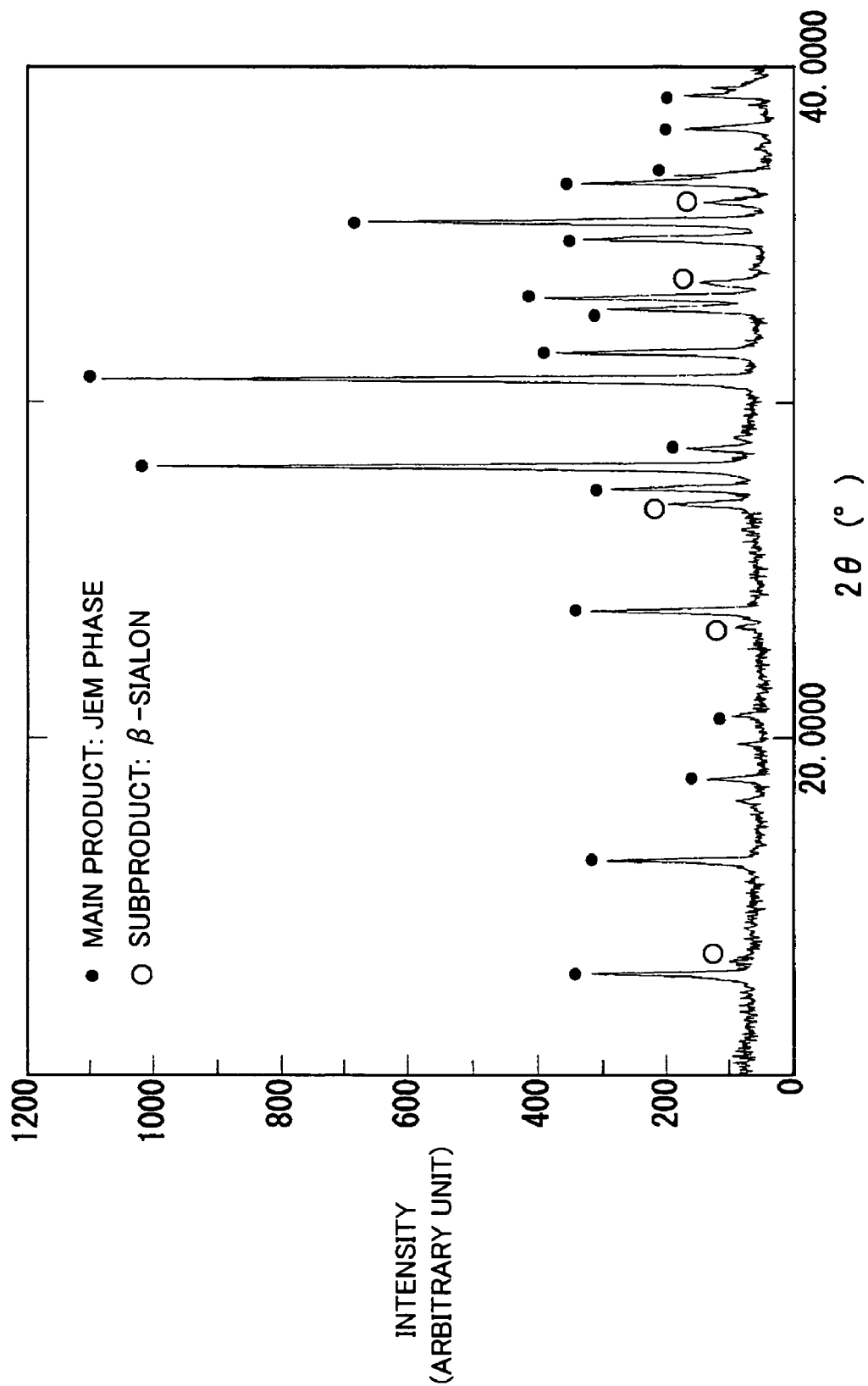
FIG. 1 is a graph showing the result of an X-ray diffraction measurement of an oxynitride phosphor according to Example 2.

The invention relates to an oxynitride phosphor that is represented by a composition formula $M_{1-a}Ce_aSi_bAl_cO_dN_e$ and contains a JEM phase in an amount of 50% or more. Here, M in the composition formula denotes La or a compound of which main component is La and sub-component is at least one kind of element selected from the group consisting of Pr, Nd, Sm, Eu, Gd, Th, Dy, Ho, Er, Tm, Yb and Lu. Furthermore, a in the composition formula, which represents a composition ratio of Ce, is a real number satisfying $0.1 \leq a \leq 1$. Furthermore, b in the composition formula, which represents a composition ratio of Si, is a real number satisfying $b=(6-z) \times f$. Still furthermore, c in the composition formula, which represents a composition ratio of Al, is a real number satisfying $c=(1+z)\times g$. Furthermore, d in the composition formula, which represents a composition ratio of O, is a real number satisfying $d=z\times h$. Still furthermore, e in the composition formula, which represents a composition ratio of N, is a real number satisfying $e=(10-z)\times i$. In addition, the z is a real number satisfying $0.1 \leq z \leq 3$, the f is a real number satisfying $0.7 \leq f \leq 1.3$, the g is a real number satisfying $0.7 \leq g \leq 3$, the h is a real number satisfying $0.7 \leq h \leq 3$, and the i is a real number satisfying $0.7 \leq i \leq 1.3$. That is, it is an indispensable condition that the z is a real number satisfying $0.1 \leq z \leq 3$, the f is a real number satisfying $0.7 \leq f \leq 1.3$, the g is a real number satisfying $0.7 \leq g \leq 3$, the h is a real number satisfying $0.7 \leq h \leq 3$, and the i is a real number satisfying $0.7 \leq i \leq 1.3$, and when the condition is not satisfied, a ratio of the JEM phase becomes less than 50%, resulting in largely deteriorating the emission efficiency of the oxynitride phosphor.

So far, in similar materials, it has been considered that excellent emission characteristics can be obtained when a composition ratio a of Ce is such low as less than 0.1 (Japanese Patent Laying-Open No. 2003-206481). However, as a result of detailed study of the inventors, it was found that in an oxynitride material having a JEM phase as a main component, when the composition ratio a of Ce is 0.1 or more, a highly efficient oxynitride phosphor can be obtained. This is considered caused by essential characteristics of a material such as a structure of an energy level being changed owing to Ce-activation and the completeness of a crystal being improved, and an utterly novel phenomenon.

The composition ratio a of Ce is preferable to be $0.2 \leq a \leq 0.7$ from a viewpoint of improving the emission efficiency and more preferable to be $0.3 \leq a \leq 0.5$ from a viewpoint of further improving the emission efficiency.

Furthermore, the oxynitride phosphor according to the invention preferably contains 50% or more of a JEM phase represented by a formula $M_{1-a}Ce_aAl(Si_{6-z}Al_z)N_{10-z}O_z$ (in the formula, M denotes La or a compound of which main component is La and sub-component is at least one kind of element selected from the group consisting of Pr, Nd, Sm, Eu, Gd, Th, Dy, Ho, Er, Tm, Yb and Lu) in the oxynitride phosphor. In the composition, in particular, the oxynitride phosphor according to the invention can be obtained much.

Still furthermore, an emission peak wavelength of the oxynitride phosphor according to the invention is preferably in the range of 460 or more and 510 nm or less. The oxynitride phosphor according to the invention, which is represented by the foregoing composition formula, has the emission peak wavelength particularly in the above-mentioned wavelength region; accordingly, it can be used as an efficient phosphor emitting light from blue to blue-green.

Furthermore, the oxynitride phosphor according to the invention preferably contains the JEM phase in an amount of 70% or more and 90% or less. From a viewpoint of emission, the JEM phase that is a constituent component of the oxynitride phosphor is considered desirable to be highly pure and contained as much as possible. However, the inventors found that the optimum value thereof is rather desirable to be 70% or more and 90% or less.

Still furthermore, in the oxynitride phosphor according to the invention, preferably, the d that represents a composition ratio of O in the composition formula is a real number satisfying $1 < d \leq 2$, and the e that represents a composition ratio of N is a real number satisfying $8 < e < 9$. This is because in the composition, the emission efficiency more excellent than that when the JEM phase has a theoretical composition ratio where z=1, that is, b=5, c=2, d=1 and e=9 can be obtained.

Furthermore, the invention relates to a semiconductor light-emitting device that includes a semiconductor light-emitting element that emits light having an emission peak wavelength of 370 nm or more and 420 nm or less and a first phosphor that is excited by light emitted from the semiconductor light-emitting element and has an emission peak wavelength of 460 nm or more and 510 nm or less, wherein the first phosphor is the oxynitride phosphor according to the invention. In this case, a semiconductor light-emitting device excellently emitting light from blue to blue-green can be obtained.

Here, in the semiconductor light-emitting device according to the invention, it is preferable that a composition ratio a of Ce of the first phosphor is $0.8 \leq a \leq 1$, a color coordinate x of an emission color of emission from the first phosphor is 0.22 or more and 0.44 or less, and a color coordinate y thereof is 0.22 or more and 0.44 or less. In this case, since white light can be obtained with a single first phosphor, a manufacture management becomes very easy and variation of emission color within the semiconductor light-emitting device and between semiconductor light-emitting devices can be further lessened.

Furthermore, the semiconductor light-emitting device according to the invention is a semiconductor light-emitting device that includes a semiconductor light-emitting element that emits light of which emission peak wavelength is 370 nm or more and 420 nm or less, a first phosphor that is excited by light emitted from the semiconductor light-emitting element and has an emission peak wavelength of 460 nm or more and 510 nm or less, and a second phosphor that is excited by light emitted from the semiconductor light-emitting element and has an emission peak wavelength of 510 nm or more and 670 nm or less, wherein the first phosphor is the foregoing oxynitride phosphors according to the invention. In this case, a semiconductor light-emitting device that emits light having a spectrum suitable for illumination such as white can be obtained. The second phosphor preferably contains Si and N in a total amount of 50% by mole or more. In this case, the first and second phosphors both contain Si and N and the temperature dependencies of the emission efficiencies thereof can be made similar; accordingly, a semiconductor light-emitting device less in the temperature dependency in the range of for instance 0 to 100° C. can be obtained.

Still furthermore, the semiconductor light-emitting device according to the invention is a semiconductor light-emitting device that includes a semiconductor light-emitting element that emits light of which emission peak wavelength is 370 nm or more and 420 nm or less, a first phosphor that is excited by light emitted from the semiconductor light-emitting element and has an emission peak wavelength of 460 nm or more and 510 nm or less, a second phosphor that is excited by light emitted from the semiconductor light-emitting element and has an emission peak wavelength of 600 nm or more and 670 nm or less, and a third phosphor that is excited by light emitted from the semiconductor light-emitting element and has an emission peak wavelength of 510 nm or more and 550 nm or less, wherein the first phosphor is any one of the foregoing oxynitride phosphors according to the invention, and at least one of the second and third phosphors contains Si and N in a total amount of 50% by mole or more. In this case, the first, second and third phosphors all contain Si and N and the temperature dependencies of the emission efficiencies thereof can be made similar; accordingly, a semiconductor light-emitting device less in the temperature dependency in the range of for instance 0 to 100 ° C. can be obtained. Furthermore, since three phosphors are used, white light excellent in the color rendering property can be readily obtained.

Furthermore, in the semiconductor light-emitting device according to the invention, a semiconductor light-emitting element preferably contains an InGaN active layer. A semiconductor light-emitting element having an InGaN active layer, being a light source small in size, strong to vibration and high in the efficiency in the wavelength region, when combined with the phosphor material according to the invention, can form a semiconductor light-emitting device suitable for various applications such as illumination and backlight for liquid crystal display.

Furthermore, in the semiconductor light-emitting device according to the invention, an emission peak wavelength of the semiconductor light-emitting element is preferably 390 nm or more and 420 nm or less. The oxynitride phosphor according to the invention is designed so as to efficiently emit to the peak wavelength; accordingly, with the combination, excellent emission efficiency can be obtained.

The oxynitride phosphor according to the invention can be made different in an excitation spectrum and an emission spectrum depending on the composition. In order to obtain efficient emission with an excitation wavelength of 390 nm or more and 420 nm or less, which is an object of the invention, a solid solution at an appropriate composition of La and Ce is desirably formed. When the composition ratio a of Ce is 0.1 or more, the excitation spectrum is increased in width and extended toward a longer wavelength side; accordingly, emission with excitation wavelengths of 390 nm or more and 420 nm or less rapidly increases. Accordingly, when the composition ratio a of Ce of the oxynitride phosphor according to the invention is made 0.1 or more, an efficient semiconductor light-emitting device with a semiconductor light-emitting element that emits light having a wavelength of 390 nm or more and 420 nm or less can be obtained.

In the semiconductor light-emitting device according to the invention, an emission color preferably has white color that has a color coordinate x of 0.22 or more and 0.44 or less, and a color coordinate y of 0.22 or more and 0.44 or less, or filament lamp color that has a color coordinate x of 0.36 or more and 0.50 or less, and a color coordinate y of 0.33 or more and 0.46 or less. The semiconductor light-emitting device having white or filament lamp color can be used in illumination applications in place of an existing fluorescent lamp or filament lamp. Thereby, low power consumption can be achieved and replacement frequencies of fluorescent lamps or filament lamps can be largely reduced. In particular, when the oxynitride phosphor according to the invention, which emits light in blue to blue-green, is used, illumination excellent in the color rendering properties can be realized.

Hereinafter, with reference to specific examples, the oxynitride phosphor having high emission efficiency according to the invention and features of a semiconductor light-emitting device using the oxynitride phosphor will be detailed.

EXAMPLES

Examples 1 through 10

Ten kinds of example samples of which composition formula is represented by $La_{1-a}Ce_aSi_5Al_2O_{1.5}N_{8.7}$ and composition ratios a of Ce, respectively, are different in the range of $0.1 \leq a \leq 1$ and four kinds of comparative example samples having separate composition ratios a of Ce were prepared as follows.

Silicon nitride powder having an average particle diameter of 0.5 μm, an oxygen content of 0.93 mass % and an α-type content of 92%, aluminum nitride powder, lanthanum oxide powder and cerium oxide powder were weighed so as to be material ratios (mass %) shown respectively in Table 2 and mixed. The mixed powder was put in a boron nitride crucible and the crucible was introduced in a graphite resistance heating electric furnace.

TABLE 2

| Composition ratio of Ce | Raw material composition (percent by mole) | | | |
|---|---|---|---|---|
| | $Si_3N_4$ | $La_2O_3$ | $CeO_2$ | AlN |
| Example 1 | 0.1 | 48.747 | 30.57 | 3.59 | 17.09 |
| Example 2 | 0.2 | 48.653 | 27.12 | 7.16 | 17.06 |
| Example 3 | 0.3 | 48.56 | 23.69 | 10.7 | 17.03 |
| Example 4 | 0.4 | 48.467 | 20.26 | 14.3 | 17.00 |
| Example 5 | 0.5 | 48.374 | 16.85 | 17.8 | 16.96 |
| Example 6 | 0.6 | 48.283 | 13.46 | 21.3 | 16.93 |
| Example 7 | 0.7 | 48.191 | 10.07 | 24.8 | 16.90 |
| Example 8 | 0.8 | 48.099 | 6.70 | 28.3 | 16.87 |
| Example 9 | 0.9 | 48.009 | 3.35 | 31.8 | 16.83 |
| Example 10 | 1 | 47.918 | 0.00 | 35.3 | 16.80 |
| Comparative example1 | 0 | 48.84 | 34.03 | 0.000 | 17.13 |
| Comparative example2 | 0.01 | 48.831 | 33.69 | 0.360 | 17.12 |
| Comparative example3 | 0.025 | 48.817 | 33.17 | 0.898 | 17.12 |
| Comparative example4 | 0.05 | 48.793 | 32.30 | 1.796 | 17.11 |

In the next place, the inside of the electric furnace was evacuated with a vacuum pump, followed by heating from room temperature to 800° C. Here, a nitrogen gas of which purity is 99.999% by volume was introduced to set pressure at 1 MPa. Furthermore, a temperature was raised at a velocity of substantially 500° C./hr to 1700° C. and kept there for 2 hr to sinter. After sintering, the temperature was lowered to room temperature and a sample was taken out. The sintering process was carried out for each of ten kinds of example samples and four kinds of comparative example samples. Element compositions of these samples after sintering are shown in Table 3.

TABLE 3

| | Product composition (atomic percent) | | | | | |
|---|---|---|---|---|---|---|
| | Si | La | Ce | Al | O | N |
| Example 1 | 27.523 | 4.9541 | 0.5505 | 11.009 | 8.2569 | 47.706 |
| Example 2 | 27.523 | 4.4037 | 1.1009 | 11.009 | 8.2569 | 47.706 |
| Example 3 | 27.523 | 3.8532 | 1.6514 | 11.009 | 8.2569 | 47.706 |
| Example 4 | 27.523 | 3.3028 | 2.2018 | 11.009 | 8.2569 | 47.706 |
| Example 5 | 27.523 | 2.7523 | 2.7523 | 11.009 | 8.2569 | 47.706 |
| Example 6 | 27.523 | 2.2018 | 3.3028 | 11.009 | 8.2569 | 47.706 |
| Example 7 | 27.523 | 1.6514 | 3.8532 | 11.009 | 8.2569 | 47.706 |
| Example 8 | 27.523 | 1.1009 | 4.4037 | 11.009 | 8.2569 | 47.706 |
| Example 9 | 27.523 | 0.5505 | 4.9541 | 11.009 | 8.2569 | 47.706 |
| Example 10 | 27.523 | 0.0000 | 5.5046 | 11.009 | 8.2569 | 47.706 |
| Comparative example1 | 27.523 | 5.5046 | 0.0000 | 11.009 | 8.2569 | 47.706 |
| Comparative example2 | 27.523 | 5.4495 | 0.0550 | 11.009 | 8.2569 | 47.706 |
| Comparative example3 | 27.523 | 5.3670 | 0.1376 | 11.009 | 8.2569 | 47.706 |
| Comparative example4 | 27.523 | 5.2294 | 0.2752 | 11.009 | 8.2569 | 47.706 |

Sintered bodies according to the foregoing method were evaluated by the method shown below and found that a JEM phase represented by a formula $M_{1-a}Ce_aAl(Si_{6-z}Al_z)N_{10-z}O_z$ (in the formula, M denotes La or a compound of which main component is La and sub-component is at least one kind of element selected from the group consisting of Pr, Nd, Sm, Eu, Gd, Tb, Dy, Ho, Er, Tm, Yb and Lu, and $0.1 \leq a \leq 1$ and $0.1 \leq z < 3$) was a main component. In the beginning, a sintered sample was pulverized to a powder in a mortar, followed by carrying out a powder X-ray diffraction measurement with Cu—Kα line. In FIG. 1, a typical measurement result is shown. This is the result of a powder X-ray diffraction measurement of a sample according to Example 2. When each of peaks of X-ray diffraction was identified as a crystal orientation index to give an index, results shown in Table 4 were obtained. In table 4, h, k, and l denote crystal indices, 2θ denotes an angle of diffraction, d represents an interplanar spacing and I denotes a diffraction intensity.

TABLE 4

| h | k | l | 2θ | d | I |
|---|---|---|------|--------|-----|
| 1 | 1 | 0 | 13.052 | 6.7776 | 23 |
| 1 | 1 | 1 | 16.401 | 5.4001 | 22 |
| 2 | 0 | 0 | 18.820 | 4.7113 | 9 |
| 0 | 0 | 2 | 19.854 | 4.4681 | 4 |
| 0 | 2 | 1 | 20.728 | 4.2817 | 5 |
| 1 | 1 | 2 | 23.833 | 3.7304 | 26 |
| 0 | 2 | 2 | 27.040 | 3.2949 | 14 |
| 2 | 0 | 2 | 27.489 | 3.2420 | 23 |
| 2 | 2 | 1 | 28.139 | 3.1686 | 94 |
| 1 | 2 | 2 | 28.679 | 3.1102 | 11 |
| 1 | 3 | 1 | 30.732 | 2.9069 | 100 |
| 3 | 1 | 1 | 31.528 | 2.8353 | 33 |
| 1 | 1 | 3 | 32.815 | 2.7270 | 25 |
| 2 | 2 | 2 | 33.151 | 2.7001 | 38 |
| 3 | 0 | 2 | 34.888 | 2.5695 | 32 |
| 3 | 2 | 1 | 35.415 | 2.5325 | 65 |
| 1 | 2 | 3 | 36.580 | 2.4545 | 32 |
| 0 | 4 | 0 | 36.820 | 2.4390 | 14 |
| 0 | 4 | 1 | 38.218 | 2.3530 | 15 |
| 2 | 3 | 2 | 39.205 | 2.2960 | 16 |

When, with lattice constants obtained from the above results and atomic coordinates shown in Table 1, an X-ray diffraction pattern simulation was carried out according to a Rietveld analysis calculation program (F. Izumi et al., "A Rietveld-analysis program RIETAN-98 and its applications to zeolites", EUROPEAN POWDER DIFFRACTION, PTS 1 AND 2, 321-3; pp. 198-203 Part 1 & 2, 2000, MATERIALS SCIENCE FORUM), it was found that main X-ray peaks were caused by the JEM phase and there were some sub-peaks due to β-sialon. From the results, a sample according to Example 2 was found to have the JEM phase as a main component and the β-sialon as a sub-product. Furthermore, when a ratio of the JEM phase was calculated from intensity ratios of peaks of the JEM phase and β-sialon, it was confirmed that ratios of the JEM phase of the respective examples were values as shown in Table 5. It was confirmed that a compound sintered according to the above method contains the JEM phase at such a high ratio as 80% or more. The ratio of the JEM phase shown in Table 5 was calculated from an equation below. Ratio of JEM phase (%)=100×(intensity of maximum peak of JEM phase)/(intensity of maximum peak of JEM phase+intensity of maximum peak of β-sialon)

TABLE 5

| | Ratio of JEM phase (%) |
|---|---|
| Example 1 | 88 |
| Example 2 | 81 |
| Example 3 | 86 |
| Example 4 | 85 |
| Example 5 | 88 |
| Example 6 | 85 |
| Example 7 | 80 |
| Example 8 | 86 |
| Example 9 | 82 |
| Example 10 | 84 |
| Comparative Example 1 | 91 |
| Comparative Example2 | 86 |
| Comparative Example3 | 89 |
| Comparative Example4 | 86 |

Figure 2:
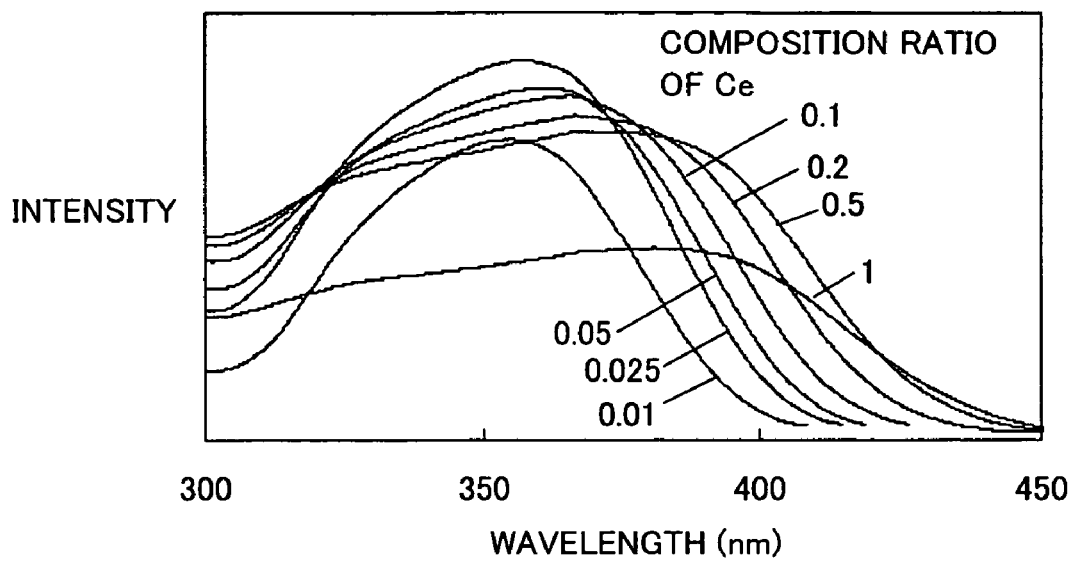
FIG. 2 is a graph showing measurement results showing a relationship (excitation spectrum) between an excitation wavelength and an emission intensity of each of example samples and comparative example samples.

Subsequently, in order to apply the compounds to phosphors of which excitation light source is an LED having an emission wavelength from violet to near ultraviolet, excitation spectrum characteristics and emission spectrum characteristics were investigated. Excitation spectra when a composition ratio a of Ce was varied are shown in FIG. 2. When a composition ratio a of Ce is varied, the excitation spectrum varies largely. When a composition ratio a of Ce is 0.1, a peak wavelength is about 370 nm, and as a composition ratio a of Ce is increased, the spectrum increases in a width and is expanded toward a longer wavelength side. As a result, emission due to excitation by a wavelength of 390 nm or more and 420 nm or less rapidly increases.

Figure 3:
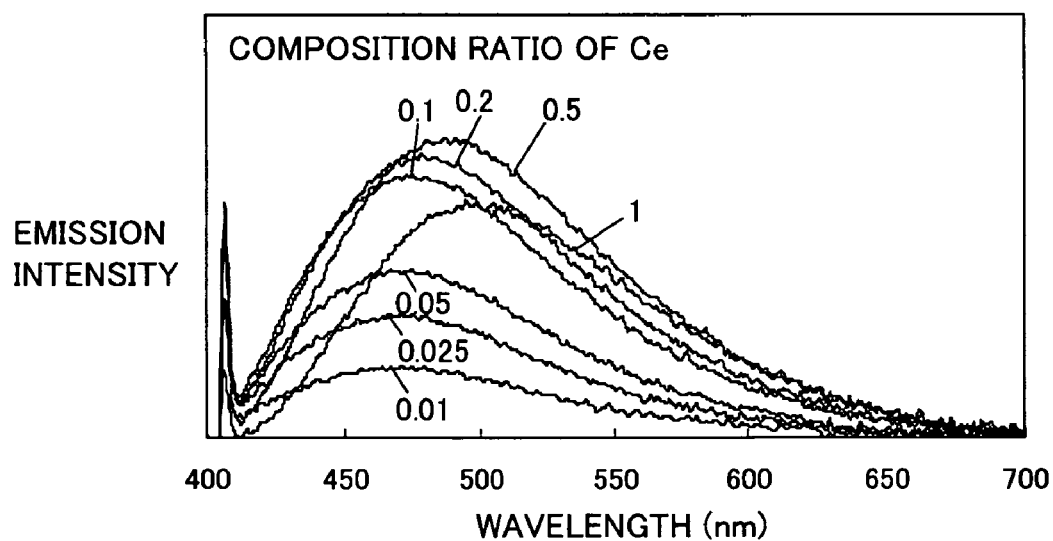
FIG. 3 is a graph showing measurement results showing a relationship (emission spectrum) between an emission wavelength and an emission intensity of each of example samples and comparative example samples.
Figure 5:
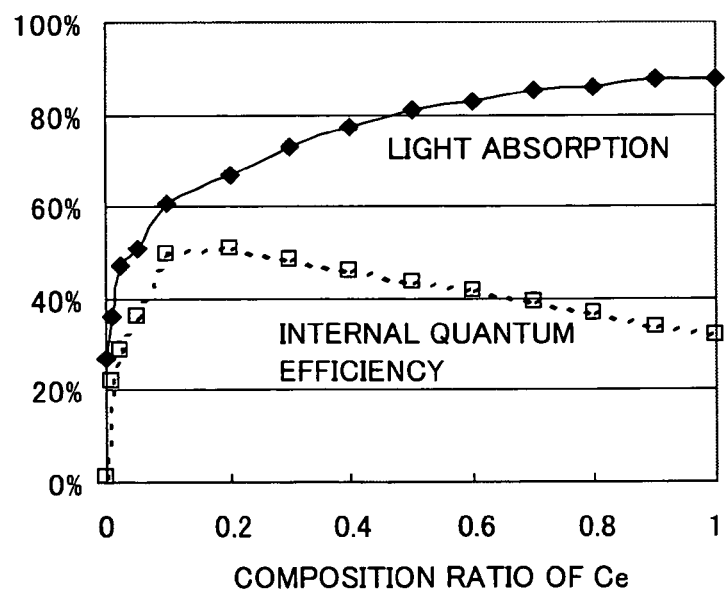
FIG. 5 is a graph showing measurement results showing a relationship between a composition ratio of Ce, an internal quantum efficiency and light absorptivity of each of example samples and comparative example samples.

FIG. 3 shows emission spectra of typical Ce composition ratios when light having a wavelength of 405 nm was used to excite. As the excitation light, a monochromatized Xe-lamp light source was used. Therefrom, it was found that, in samples according to Examples 1, 2, 5 and 10 where the composition ratio a of Ce exceeds 0.1, emission intensities are very high in comparison with that of Comparative Examples 2, 3 and 4. In the next place, with each of the samples, by use of an integral sphere, a total flux emission spectrum measurement was carried out (reference literature: Kazuaki Ohkubo et al., "Absolute Fluorescent Quantum Efficiency of NBS Phosphor Standard Samples", J. Illum. Engng. Inst. Jpn. Vol. 83 No. 2, 1999, pp. 87-93). For the excitation light, similarly, a monochromatized Xe-lamp having a wavelength of 405 nm was used. FIG. 5 shows light absorptions and internal quantum efficiencies of Examples 1 through 10 and Comparative Examples 1 through 4. As the composition ratio a of Ce increases, the light absorption increases. However, in particular, in samples of which the composition ratio a of Ce is less than 0.1, the light absorption largely deteriorates. On the other hand, the internal quantum efficiency, as the composition ratio a of Ce increases from 0 to 0.1, goes up rapidly, and in a region where the composition ratio a of Ce is 0.1 or more, which is a region of examples of the invention, as the composition ratio a of Ce increases, tends to decrease slightly but shows a large value.

The emission efficiency of a sample is roughly proportional to a product of the light absorption of the excitation light and the internal quantum efficiency. That is, it is important that the excitation light is efficiently absorbed and the absorbed energy is efficiently transmitted from an absorption level to an emission level in a crystal to be converted efficiently into light. High light absorption in example samples, as seen in FIG. 2, is largely caused by a shift toward a longer wavelength side of the absorption spectrum due to an increase of the composition ratio a of Ce. On the other hand, the internal quantum efficiency relates to an interaction of the excitation level and the emission level. As obvious from FIG. 2 as well, in samples of which composition ratio a of Ce exceeds 0.1, the excitation spectrum is broad and it is found that a structure of the excitation level is different from that of comparative example samples where the composition ratio a of Ce is less than 0.1. The increase of the internal quantum efficiency is largely caused by a change of the energy level. The increase of the internal quantum efficiency is largely due to an increase in the completeness of the crystal as well. When the composition ratio a of Ce is increased, the crystallization during sintering can be forwarded, and thereby a JEM phase excellent in the crystallinity is formed. This is also contributes to an increase of the internal quantum efficiency.

Figure 6:
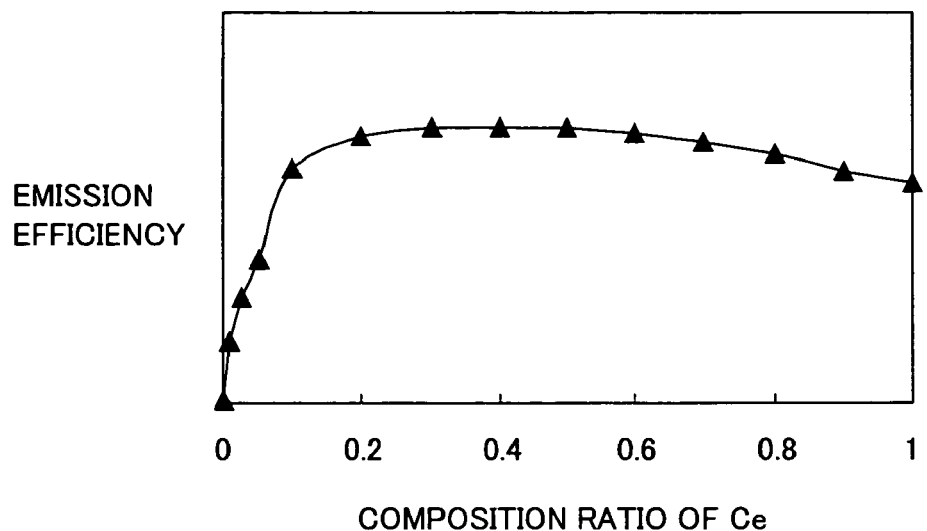
FIG. 6 is a graph showing measurement results showing a relationship between a composition ratio of Ce and emission efficiency of each of example samples and comparative example samples.

From the foregoing results, according to the oxynitride phosphor of the invention, it was found that light that has a wavelength from violet to near ultraviolet could be very efficiently converted into blue emission. In FIG. 6, the Ce composition ratio dependency of the emission efficiency when excitation light having a wavelength of 405 nm is used is shown for example samples and comparative example samples. It is found that, in samples where the composition ratio a of Ce is 0.1 or more, high emission efficiency can be obtained.

In example samples where the composition ratio a of Ce is from 0.1 to 1, substantially same high emission efficiencies could be obtained. This is because, as shown in FIG. 5, with an increase in the composition ratio a of Ce, while the light absorption increases, the internal quantum efficiency decreases, and resultantly both variations are cancelled out.

Figure 4:
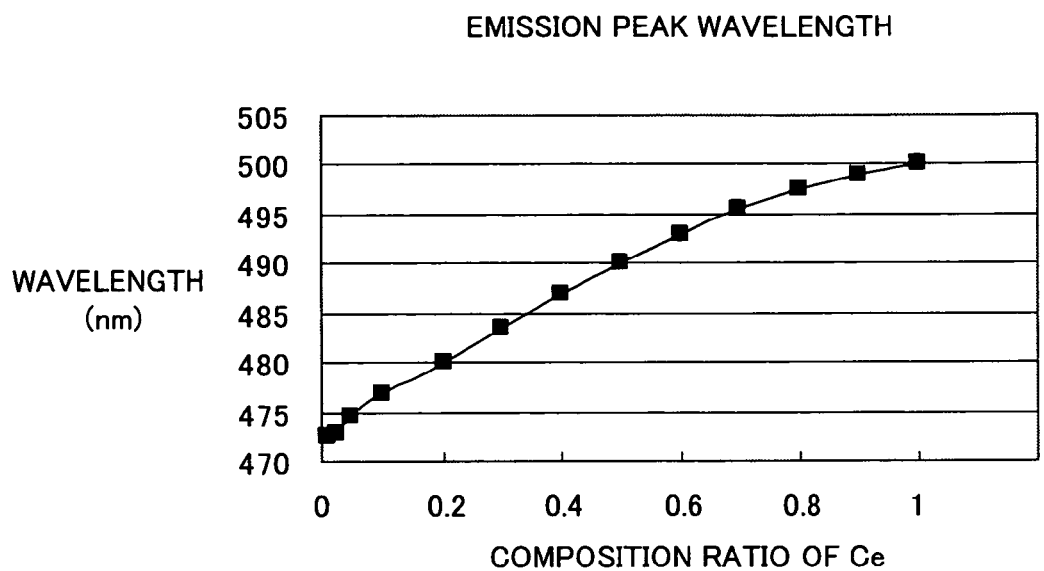
FIG. 4 is a graph showing measurement results showing a relationship between a composition ratio of Ce and an emission peak wavelength of each of example samples and comparative example samples.

In FIG. 4, emission peak wavelengths of the respective samples are shown. It is found that when the composition ratio a of Ce is increased from 0.1 to 1, the peak wavelength shifts toward a longer wavelength side more than 20 nm. By making use of this nature, without varying the emission efficiency, a wavelength can be freely designed. The nature is preferable for controlling the color tone of an emission spectrum of an LED.

So far, in similar materials, it is considered that, in a region where the composition ratio a of Ce is lower than 0.1, excellent emission characteristics can be obtained (Japanese Patent Laying-Open No.2003-206481). However, as a result of the inventors' detailed study, it was found that, when the JEM phase is a main component, in the case of the composition ratio a of Ce being 0.1 or more, a highly efficient phosphor can be obtained. This is due to essential features of a material such as a change of a structure of an energy level due to Ce-activation and an improvement of the completeness of a crystal, and considered an utterly novel phenomenon. Furthermore, in the range of such composition ratio a of Ce, high emission efficiency can be obtained also in other excitation wavelengths.

Figure 7:
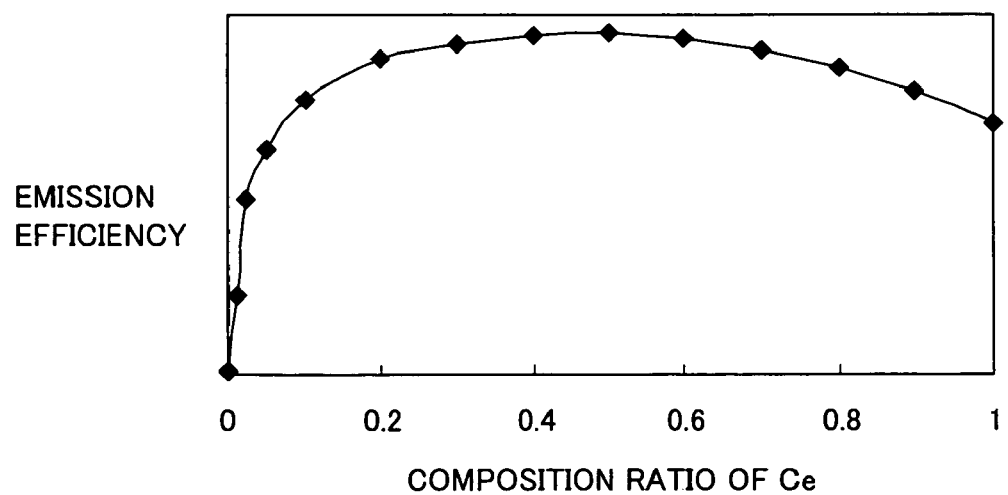
FIG. 7 is a graph showing measurement results showing a relationship between a composition ratio of Ce and emission efficiency at an excitation wavelength of 390 nm of each of example samples and comparative example samples.
Figure 8:
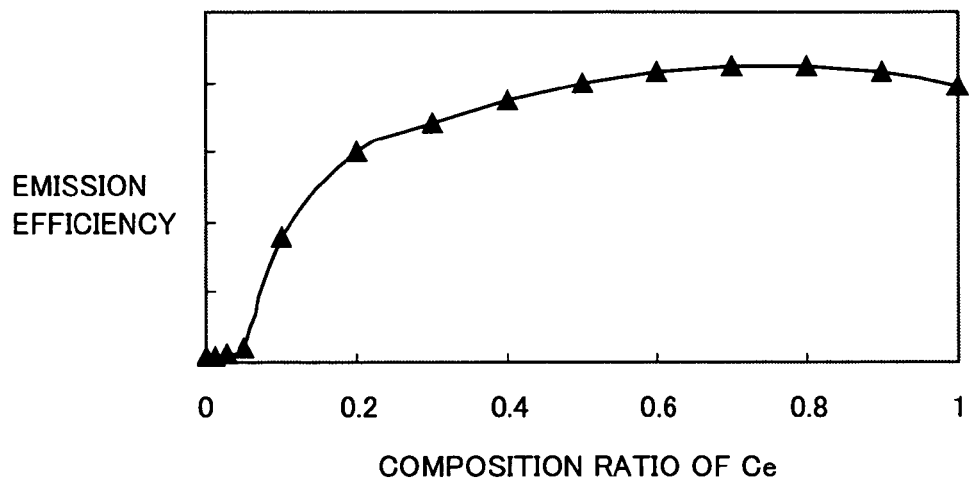
FIG. 8 is a graph showing measurement results showing a relationship between a composition ratio of Ce and emission efficiency at an excitation wavelength of 420 nm of each of example samples and comparative example samples.

FIG. 7 shows the emission efficiency when the excitation wavelength is 390 nm and FIG. 8 shows the emission efficiency when the excitation wavelength is 420 nm. In all cases, when the composition ratio a of Ce is 0.1 or more and 1 or less, an excellent emission efficiency can be obtained. In particular, in the case of the excitation wavelength being 390 nm, a range where the composition ratio a of Ce is 0.1 or more and 0.8 or less, and in the case of the excitation wavelength being 420 nm, a range where the composition ratio a of Ce is 0.2 or more and 1 or less are preferable. Accordingly, it was found that the phosphor according to the invention is suitable for an LED that has light having a wavelength from purple to near ultraviolet as the excitation light.

Example 11

In the next place, an example of a semiconductor light-emitting device according to the invention, which uses an oxynitride phosphor according to Example 3 and has high brightness, will be described.

Figure 9:
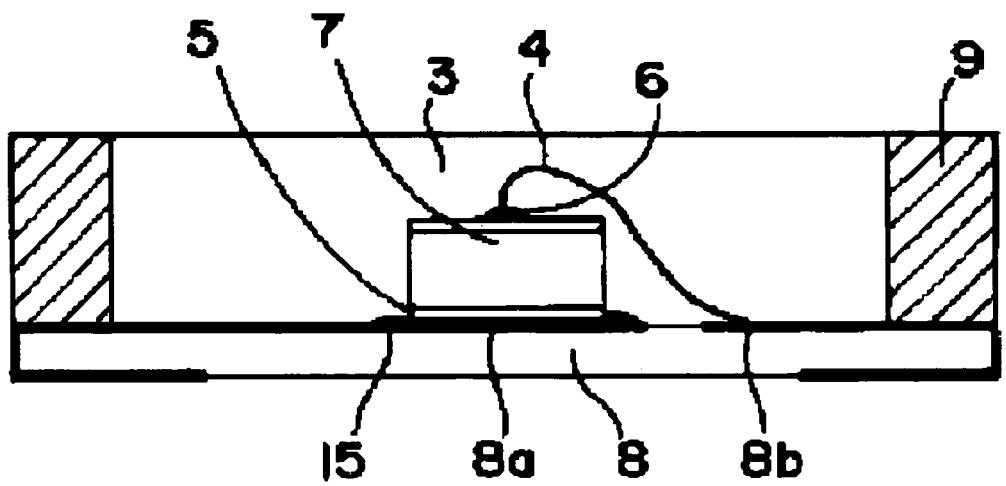
FIG. 9 is a sectional view of a semiconductor light-emitting device in Examples 11 through 14.

FIG. 9 is a sectional view showing a semiconductor light-emitting device according to Example 11 of the invention. The semiconductor light-emitting device shown in FIG. 9 has a semiconductor light-emitting element 7 that has an InGaN layer as an active layer and an emission peak wavelength at 405 nm disposed on a printed wiring board 8 as a substrate. Inside of a resin frame 9, a mold resin 3 made of a transparent epoxy resin in which a phosphor is dispersed is filled to seal the semiconductor light-emitting element 7. Inside of the resin frame 9, one electrode portion 8a on the printed wiring board 8 and an N side electrode 5 on a bottom surface of the semiconductor light-emitting element 7 are adhered with an adhesive 15 having the electrical conductivity to electrically connect. On the other hand, a P side electrode 6 disposed on a top surface of the semiconductor light-emitting element 7 is electrically connected to the other electrode portion 8b on the printed wiring board 8 through a metal wire 4. The electrode portions 8a and 8b are 3-dimentionally routed from a top surface of the printed wiring board 8 to a bottom surface that is a mounting surface and extended to both ends of a bottom surface of the printed wiring board, respectively.

In the phosphor dispersed in the mold resin 3, three kinds of phosphors below are blended so as to obtain white emission color. That is, a first phosphor (emission peak wavelength: 480 nm) made of an oxynitride phosphor that is represented by a composition formula $La_{0.7}Ce_{0.3}Si_5Al_2O_{1.5}N_{8.7}$ according to Example 3 and has blue emission as a main emission peak, a second phosphor (emission peak wavelength: 659 nm) that is represented by a formula $0.5MgF_2 \cdot 3.5MgO \cdot GeO_2 \cdot Mn$ and has a red emission as a main emission peak and a third phosphor (emission main peak wavelength: 521 nm) that is represented by a formula $SrAl_2O_4:Eu^{2+}$ and has a green emission as a main emission peak were blended and dispersed.

Figure 10:
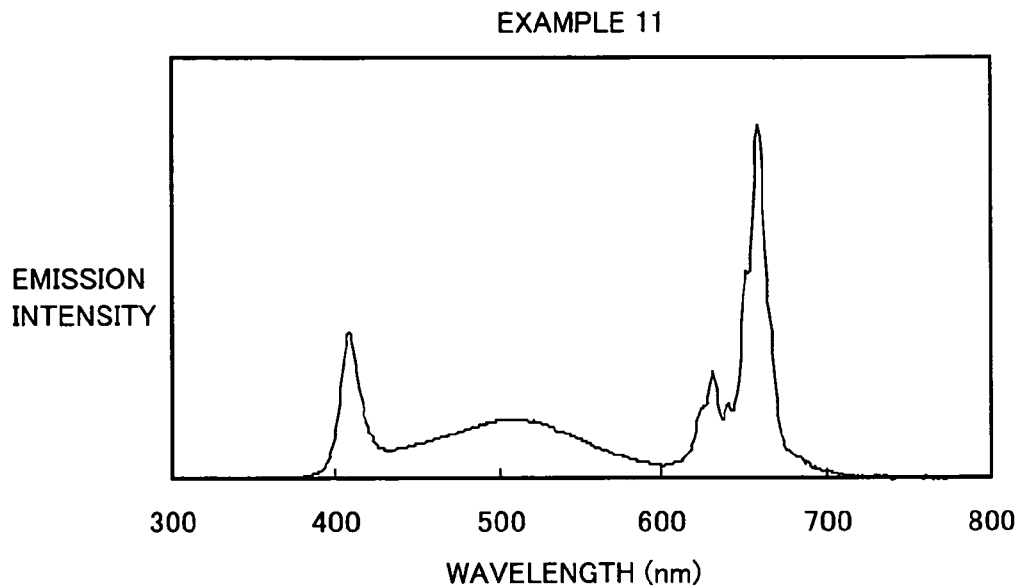
FIG. 10 is a graph showing an emission spectrum of a semiconductor light-emitting device according to Example 11.

An emission spectrum of the semiconductor light-emitting device according to the example is shown in FIG. 10. When, in addition to the foregoing green-emitting and red-emitting oxide phosphors that have efficient emissions owing to excitation light from purple to near ultraviolet, the blue-emitting oxynitride phosphor according to Example 3 was blended and dispersed, a semiconductor light-emitting device brighter more than ever was obtained.

Example 12

In the next place, another example of a bright semiconductor light-emitting device that uses the oxynitride phosphor prepared according to Example 6 will be explained.

A sectional structure of the semiconductor light-emitting device according to the example has a structure similar to that of FIG. 9. Similarly, in order to obtain white emission color, three kinds of phosphors below were blended and dispersed in a mold resin. In the example, a first phosphor (emission peak wavelength: 484 nm) made of an oxynitride phosphor that is represented by a composition formula $La_{0.4}Ce_{0.6}Si_5Al_2O_{1.5}N_{8.7}$ according to Example 6 and has blue emission as a main emission peak, a second phosphor (emission peak wavelength: 655 nm) that is represented by a formula $CaAlSiN_3:Eu^{2+}$ and has a red emission as a main emission peak and a third phosphor (emission peak wavelength: 537 nm) that is represented by a formula β-sialon: $Eu^{2+}$ and has a green emission as a main emission peak were blended and dispersed.

Figure 11:
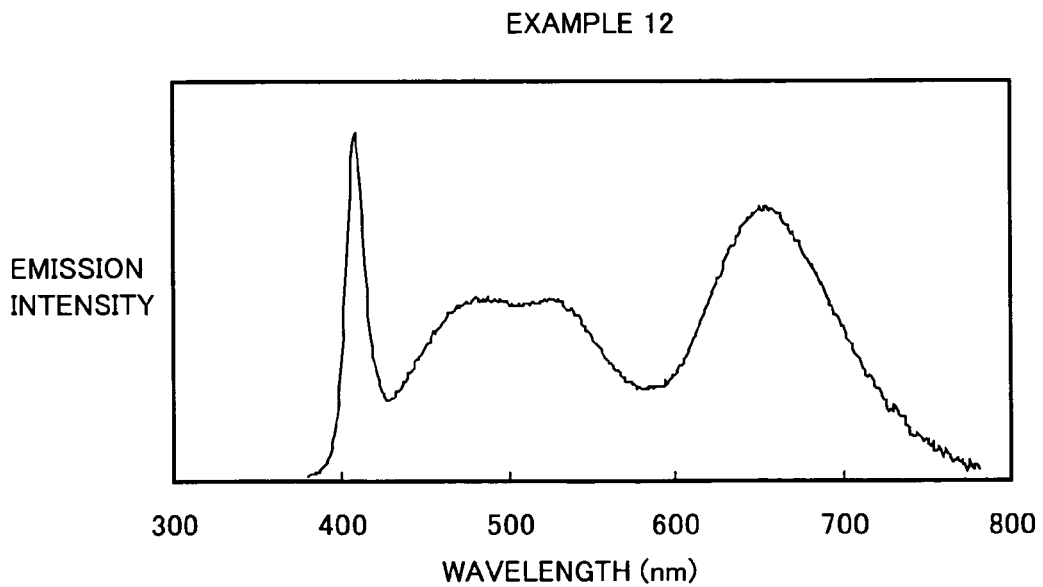
FIG. 11 is a graph showing an emission spectrum of a semiconductor light-emitting device according to Example 12.

An emission spectrum of the semiconductor light-emitting device according to the example is shown in FIG. 11. When three kinds of the foregoing blue-emitting, green-emitting and red-emitting phosphors that have efficient emissions owing to excitation light from purple to near ultraviolet were blended and dispersed, a semiconductor light-emitting device brighter more than ever was obtained. In particular, in the example, since phosphors similar in the physical properties were blended, the phosphors were dispersed with identical dispersion concentrations in the resin; accordingly, dispersions of emission colors within the semiconductor light-emitting device and between semiconductor light-emitting devices are small. Furthermore, by making use of a feature that the variation of the emission efficiency due to temperature variation during operation of the oxynitride phosphor is small, a semiconductor light-emitting device that exhibits, in an operation temperature range such wide as 0 to 100° C., a color variation ⅙ to ¼ that of a white LED that uses existing oxide phosphors, that is, hardly exhibits visual variation in the color tone was obtained. Furthermore, since the emission spectrum of the semiconductor light-emitting device contains blue, green and red color components, the color rendering properties as well are excellent.

Example 13

In the next example, an example where a semiconductor light-emitting device was prepared, by making use of a feature of an oxynitride phosphor according to the invention, in which while maintaining high brightness an emission wavelength can be freely controlled, with only two kinds of phosphors will be shown.

Figure 12:
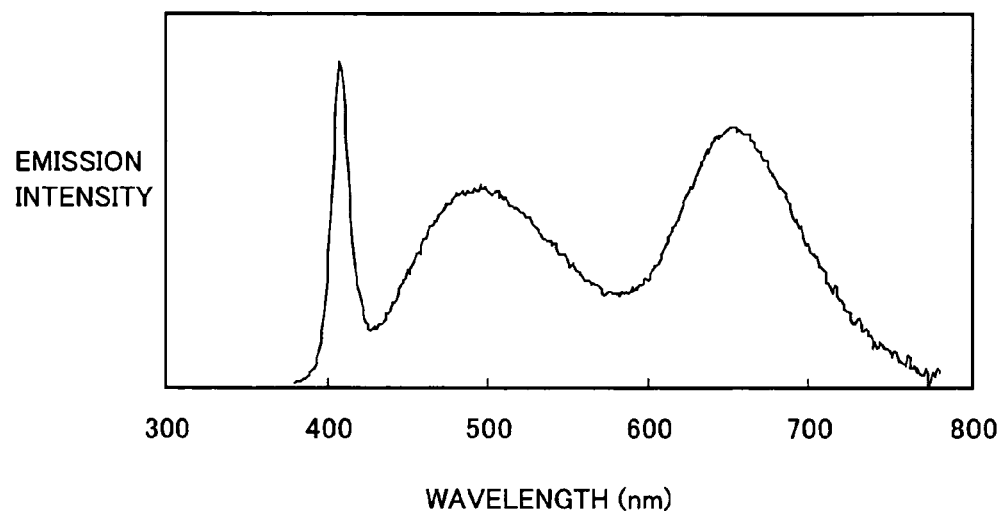
FIG. 12 is a graph showing an emission spectrum of a semiconductor light-emitting device according to Example 13.

A sectional structure of a semiconductor light-emitting device according to the example has a structure similar to that of FIG. 9. In order to obtain white emission color, two kinds of phosphors were blended and dispersed in a mold resin. In the example, a first phosphor (emission peak wavelength: 495 nm) made of an oxynitride phosphor that is represented by a composition formula $CeSi_5Al_2O_{1.5}N_{8.7}$ according to Example 10 and has blue-green emission as a main emission peak and a second phosphor (emission peak wavelength: 655 nm) that is represented by a formula $CaAlSiN_3:Eu^{2+}$ and has a red emission as a main emission peak were blended and dispersed. An emission spectrum of the semiconductor light-emitting device according to the example is shown in FIG. 12. When two kinds of the foregoing blue-green-emitting and red-emitting phosphors that have efficient emissions owing to excitation light from purple to near ultraviolet were blended and dispersed, a semiconductor light-emitting device brighter more than ever was obtained. Since a white color can be obtained with a less kinds of phosphors, dispersions of emission colors within the device and between devices could be made further smaller.

Example 14

In the next example, an example where with only one kind of phosphor a white-emitting semiconductor light-emitting device was prepared will be shown.

Figure 13:
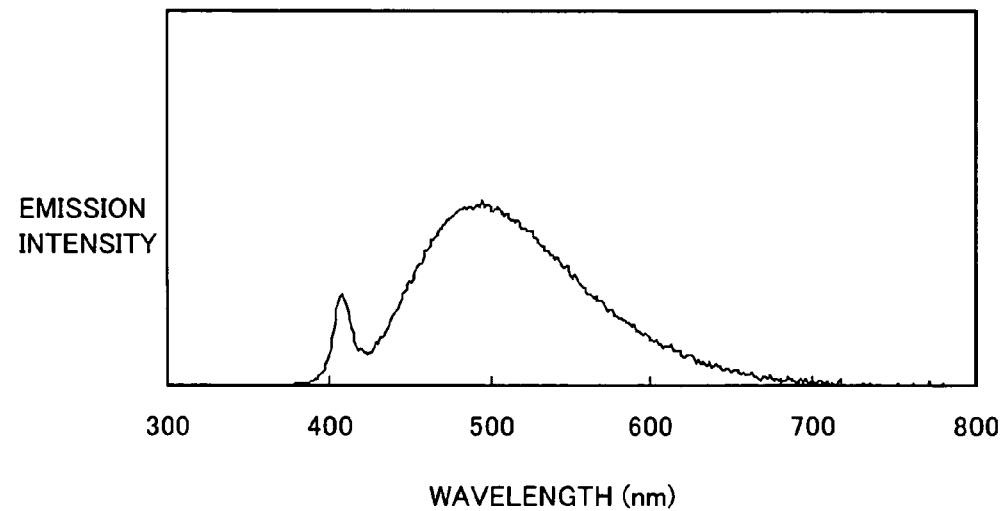
FIG. 13 is a graph showing an emission spectrum of a semiconductor light-emitting device according to Example 14.

A sectional structure of the semiconductor light-emitting device according to the example has a structure similar to that of FIG. 9. In order to obtain white emission color, in a mold resin, an oxynitride phosphor that is represented by a composition formula $CeSi_5Al_2O_{1.5}N_{8.7}$ according to Example 10 and has blue-green emission as a main emission peak as a first phosphor (emission peak wavelength: 495 nm) was blended and dispersed at a resin ratio reduced more than that of Example 13. An emission spectrum of the semiconductor light-emitting device according to the example is shown in FIG. 13. As the chromaticity of an emission color of emission from the semiconductor light-emitting device, color coordinates x and y, respectively, became 0.24 and 0.36; that is, the color coordinates x and y, respectively, were in the ranges of $0.22 \leq x \leq 0.44$ and $0.22 \leq y \leq 0.44$, which are conditions to be white. Thus, with only one kind of phosphor, white color can be obtained; accordingly, the manufacturing management becomes very easy and the dispersions of emission color within the device and between devices can be made further smaller.

Example 15

In the next example, an example where a semiconductor light-emitting device emitting in an incandescent lamp color was prepared will be described.

A sectional structure of a semiconductor light-emitting device according to the example has a structure similar to that of FIG. 9. In order to obtain incandescent lamp color, in a mold resin, a first phosphor (emission peak wavelength: 471 nm) made of an oxynitride phosphor that is represented by a composition formula $La_{0.6}Ce_{0.4}Si_5Al_2O_{1.5}N_{8.7}$ according to Example 4 and has blue green emission as a main emission peak, a second phosphor (emission peak wavelength: 655 nm) that is represented by a formula $CaAlSiN_3:Eu^{2+}$ and has a red emission as a main emission peak and a third phosphor (emission main peak wavelength: 537 nm) that is represented by a formula $\beta$-sialon:$Eu^{2+}$ and has a green emission as a main emission peak were blended and dispersed.

Figure 14:
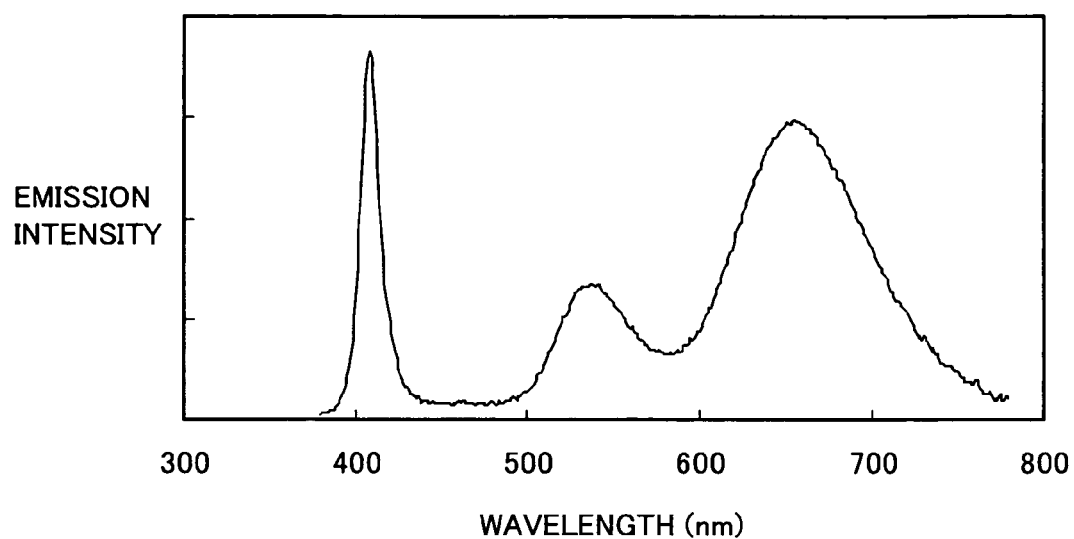
FIG. 14 is a graph showing an emission spectrum of a semiconductor light-emitting device according to Example 15.

An emission spectrum of the semiconductor light-emitting device according to the example is shown in FIG. 14. As the chromaticity of an emission color from the semiconductor light-emitting device, color coordinates x and y, respectively, became 0.46 and 0.41; that is, the color coordinates x and y, respectively, were in the ranges of $0.36 \leq x \leq 0.50$ and $0.33 \leq y \leq 0.46$, which are conditions to be incandescent lamp color. The semiconductor light-emitting device having incandescent lamp color can replace illumination of a place where an existing electric bulb is used, and thereby low power consumption can be achieved and a replacement frequency thereof can be largely reduced. Furthermore, since a spectrum of the semiconductor light-emitting device contains blue, green and red components, the color rendering properties are excellent as well.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An oxynitride phosphor represented by a composition formula $M_{1-a}Ce_aSi_bAl_cO_dN_e$, wherein M denotes La or a compound of which main component is La and sub-component is at least one kind of element selected from the group consisting of Pr, Nd, Sm, Eu, Gd, Th, Dy, Ho, Er, Tm, Yb and Lu;

the a that represents a composition ratio of Ce is a real number satisfying $0.8 \leq a \leq 1$;

the b that represents a composition ratio of Si is a real number satisfying $b=(6-z) \times f$;

the c that represents a composition ratio of Al is a real number satisfying $c=(1+z) \times g$;

the d that represents a composition ratio of O is a real number satisfying $d=z \times h$;

the e that represents a composition ratio of N is a real number satisfying $e=(10-z) \times i$;

the z is a real number satisfying $0.1 \leq z \leq 3$;

the f is a real number satisfying $0.7 \leq f \leq 1.3$;

the g is a real number satisfying $0.7 \leq g \leq 3$;

the h is a real number satisfying $0.7 \leq h \leq 3$;

the i is a real number satisfying $0.7 \leq i \leq 1.3$; and the oxynitride phosphor includes a JEM phase in an amount of 50% or more.

2. The oxynitride phosphor of claim 1, wherein the JEM phase is represented by a formula $M_{1-a}Ce_aAl(Si_{6-z}Al_z)N_{10-z}O_z$.

3. The oxynitride phosphor of claim 1, wherein an emission peak wavelength is 460 nm or more and 510 nm or less.

4. The oxynitride phosphor of claim 1, wherein the JEM phase is contained by 70% or more and 90% or less.

5. The oxynitride phosphor of claim 1, wherein the d is a real number satisfying $1<d\leq2$ and the e is a real number satisfying $8<e<9$.

6. A semiconductor light-emitting device, comprising:
a semiconductor light-emitting element that emits light of which emission peak wavelength is 370 nm or more and 420 nm or less; and
a first phosphor that is excited by light emitted from the semiconductor light-emitting element and of which emission peak wavelength is 460 nm or more and 510 nm or less;
wherein the first phosphor is an oxynitride phosphor of claim 1.

7. The semiconductor light-emitting device of claim 6, wherein a composition ratio a of Ce of the first phosphor satisfies $0.8\leq a\leq 1$, a color coordinate x of an emission color of emission from the semiconductor light-emitting device is 0.22 or more and 0.44 or less, and a color coordinate y thereof is 0.22 or more and 0.44 or less.

8. The semiconductor light-emitting device of claim 6, wherein the semiconductor light-emitting element includes an InGaN active layer.

9. The semiconductor light-emitting device of claim 6, wherein an emission peak wavelength of the semiconductor light-emitting element is 390 nm or more and 420 nm or less.

10. The semiconductor light-emitting device of claim 6, wherein a color coordinate x of an emission color of emission from the semiconductor light-emitting device is 0.22 or more and 0.44 or less, and a color coordinate y thereof is 0.22 or more and 0.44 or less, alternatively a color coordinate x of an emission color of emission from the semiconductor light-emitting device is 0.36 or more and 0.5 or less, and a color coordinate y thereof is 0.33 or more and 0.46 or less.

11. A semiconductor light-emitting device, comprising:
a semiconductor light-emitting element that emits light of which emission peak wavelength is 370 nm or more and 420 nm or less;
a first phosphor that is excited by light emitted from the semiconductor light-emitting element and has an emission peak wavelength of 460 nm or more and 510 nm or less; and
a second phosphor that is excited by light emitted from the semiconductor light-emitting element and has an emission peak wavelength of 510 nm or more and 670 nm or less;
wherein the first phosphor is an oxynitride phosphor of claim 1.

12. The semiconductor light-emitting device of claim 11, wherein the second phosphor contains Si and N in a total amount of 50% by mole or more.

13. The semiconductor light-emitting device of claim 11, wherein the semiconductor light-emitting element includes an InGaN active layer.

14. The semiconductor light-emitting device of claim 11, wherein an emission peak wavelength of the semiconductor light-emitting element is 390 nm or more and 420 nm or less.

15. The semiconductor light-emitting device of claim 11, wherein a color coordinate x of an emission color of emission from the semiconductor light-emitting device is 0.22 or more and 0.44 or less, and a color coordinate y thereof is 0.22 or more and 0.44 or less, alternatively a color coordinate x of an emission color of emission from the semiconductor light-emitting device is 0.36 or more and 0.5 or less, and a color coordinate y thereof is 0.33 or more and 0.46 or less.

16. A semiconductor light-emitting device, comprising:
a semiconductor light-emitting element that emits light of which emission peak wavelength is 370 nm or more and 420 nm or less;
a first phosphor that is excited by light emitted from the semiconductor light-emitting element and has an emission peak wavelength of 460 nm or more and 510 nm or less;
a second phosphor that is excited by light emitted from the semiconductor light-emitting element and has an emission peak wavelength of 600 nm or more and 670 nm or less; and
a third phosphor that is excited by light emitted from the semiconductor light-emitting element and has an emission peak wavelength of 510 nm or more and 550 nm or less;
wherein the first phosphor is an oxynitride phosphor of claim 1; and
at least one of the second and third phosphors contains Si and N in a total amount of 50% by mole or more.

17. The semiconductor light-emitting device of claim 16, wherein the semiconductor light-emitting element includes an InGaN active layer.

18. The semiconductor light-emitting device of claim 16, wherein an emission peak wavelength of the semiconductor light-emitting element is 390 nm or more and 420 nm or less.

19. The semiconductor light-emitting device of claim 16, wherein a color coordinate x of an emission color of emission from the semiconductor light-emitting device is 0.22 or more and 0.44 or less, and a color coordinate y thereof is 0.22 or more and 0.44 or less, alternatively a color coordinate x of an emission color of emission from the semiconductor light-emitting device is 0.36 or more and 0.5 or less, and a color coordinate y thereof is 0.33 or more and 0.46 or less.

* * * * *